(12) United States Patent
Zawada et al.

(10) Patent No.: US 10,553,779 B2
(45) Date of Patent: Feb. 4, 2020

(54) METHOD OF FABRICATING AN ACOUSTIC TRANSDUCER

(71) Applicant: MEGGIT A/S, Kvistgaard (DK)

(72) Inventors: Tomasz Zawada, Frederiksberg (DK); Ruichao Xu, København SV (DK); Michele Guizzetti, Helsingør (DK); Louise Møller Borregaard, København Ø (DK); Erling Ringgaard, Bagsværd (DK)

(73) Assignee: MEGGITT A/S, Kvistgaard (DK)

( * ) Notice: Subject to any disclaimer, the term of this patent is extended or adjusted under 35 U.S.C. 154(b) by 308 days.

(21) Appl. No.: 15/539,103

(22) PCT Filed: Dec. 23, 2014

(86) PCT No.: PCT/EP2014/079183
§ 371 (c)(1),
(2) Date: Jun. 22, 2017

(87) PCT Pub. No.: WO2016/102006
PCT Pub. Date: Jun. 30, 2016

(65) Prior Publication Data
US 2018/0226566 A1    Aug. 9, 2018

(51) Int. Cl.
*H01L 41/22* (2013.01)
*H01L 41/29* (2013.01)
(Continued)

(52) U.S. Cl.
CPC ........... *H01L 41/29* (2013.01); *B06B 1/0662* (2013.01); *H01L 41/1876* (2013.01); *Y10T 29/42* (2015.01)

(58) Field of Classification Search
CPC . H01L 41/314; Y10T 29/42; Y10T 29/49005; H03H 9/02228; H03H 9/14544;
(Continued)

(56) References Cited

U.S. PATENT DOCUMENTS 5,759,432 A     6/1998 Kumar et al.
6,440,324 B1 *  8/2002 Hayashi ............... H03H 9/178
                                              252/62.9 PZ
(Continued)

FOREIGN PATENT DOCUMENTS

EP         1875526 A1      1/2008

OTHER PUBLICATIONS

Kim, Jungsoon, et al.; Aspect Ratio Dependence of Electromechanical Coupling Coefficient k31 of Lateral-Excitation Piezoelectric Vibrator; Japanese Journal of Applied Physics, vol. 46, No. 7B, 2007, pp. 4459-4461, © 2007 The Japan Society of Applied Physics—Brief Communication.
(Continued)

*Primary Examiner* — Thiem D Phan
(74) *Attorney, Agent, or Firm* — Hackler Daghighian Martino & Novak

(57) ABSTRACT

A method of fabricating an acoustic transducer comprising: fabricating a substrate; depositing a bottom electrode on the substrate; depositing an active layer on the bottom electrode; depositing a top electrode on the active layer; wherein at least one electrode is patterned to form at least two active elements; and, wherein a ratio of a thickness coupling coefficient $k_t$ to an effective lateral coupling coefficient $k_{31,eff}$ of the active layer is 1.3 or greater.

27 Claims, 14 Drawing Sheets

(51) Int. Cl.
*B06B 1/06* (2006.01)
*H01L 41/187* (2006.01)

(58) Field of Classification Search
CPC ...... H03B 5/326; H04R 17/00; A61B 8/0833;
A61B 8/4483
USPC ..................... 29/25.35, 594, 609.1, 832, 841
See application file for complete search history.

(56) References Cited

U.S. PATENT DOCUMENTS

| | | | | |
|---|---|---|---|---|
| 7,494,602 B2 * | 2/2009 | Liufu | .................... | C04B 35/493 252/62.9 PZ |
| 2014/0082907 A1 | 3/2014 | Barthe | | |

OTHER PUBLICATIONS

PCT Written Opinion of the International Searching Authority (PCT Rule 43bis.1) for International Application No. PCT/EP2014/079183, International filing date Dec. 23, 2014.

* cited by examiner

METHOD OF FABRICATING AN ACOUSTIC TRANSDUCER

The present patent document relates to integrated multi-element acoustic transducers and methods for making the same. In particular, the present patent document relates to more efficient methods of manufacturing multi-element acoustic transducers and the products of those methods.

BACKGROUND

A multi-element acoustic transducer is suitable for transmitting/receiving ultrasound energy in applications such as medical imaging, non-destructive testing, or structural health monitoring systems. Each active element in a multi-element transducer is electrically isolated and acoustically separated from each other. Standard manufacturing of a transducer array requires machining and cutting the ceramic structure and filling the grooves with polymeric material. It would be beneficial to have a method that allows manufacturing an integrated array of active elements without the need to mechanically separate the active elements.

SUMMARY OF THE EMBODIMENTS

In view of the foregoing, an object according to one aspect of the present patent document is to provide an integrated acoustic transducer. Preferably, the methods and apparatuses address, or at least ameliorate one or more of the problems described above. To this end, methods of fabricating an acoustic transducer are provided. In one embodiment, the method of fabricating an acoustic transducer comprises: fabricating a substrate; depositing a bottom electrode on the substrate; depositing an active layer on the bottom electrode; depositing a top electrode on the active layer; wherein at least one electrode is patterned to form at least two active elements; and, wherein a ratio of a thickness coupling coefficient $k_t$ to an effective lateral coupling coefficient $k_{31,\mathit{eff}}$ of the active layer is 1.3 or greater.

In other embodiments, the ratio is 2.2 or greater and in even more preferred embodiments, the ratio is 3.0 or greater.

In some embodiments, additional steps may be part of the fabrication process. In some embodiments, an inactive interface layer is deposited on the substrate prior to depositing the bottom electrode on the inactive interface layer.

Various types of thick film manufacturing techniques may be used to create the acoustic transducer. In preferred embodiments, the bottom electrode, the top electrode and the active layer are pad printed or screen printed. In some embodiments, the active layer is deposited as a continuous thick film. In other embodiments, the active layer is patterned into individual elements during the deposition step.

Although the active layer may be made from many different materials, it is preferably made from TF2100. Sintering the active layer correctly may play a significant role in making sure the active layer has the final desired properties. In preferred embodiments, the active layer is sintered between 600° C. and 1100° C. for between 0.5 and 2 hours. In an even more preferred embodiment, the active layer is sintered between 800° C. and 950° C. In other embodiments, other temperatures and times may be used. Moreover, in order to ensure the active layer attains its piezoelectric properties, the active layer may be poled. In preferred embodiments, the active layer is poled between 100° C. and 170° C. with an applied voltage in the range of 3 kV/mm to 10 kV/mm.

In preferred embodiments, the substrate is selected and designed to provide both an integrated backing layer and a mechanical support. Integrating the backing layer and the substrate allows for some more advanced designs. In some embodiments, the substrate is machined into a curved surface prior to any of the depositing steps and the subsequent depositing steps are performed on the curved surface.

Acoustic transducers with arrays of active elements may be created by patterning either the top electrode or the bottom electrode or both during the corresponding depositing steps of each.

In another embodiment, a method of fabricating an acoustic transducer is provided that comprises: fabricating a substrate; depositing a bottom electrode on the substrate; depositing an active layer on the bottom electrode; depositing a top electrode on the active layer; poling the active layer; wherein at least one electrode is patterned to form at least two active elements; and, wherein the thickness coupling coefficient $k_t$ of the active layer is 0.32 or greater and the effective lateral coupling coefficient $k_{31,\mathit{eff}}$ of the active layer is 0.24 or less.

In more preferred embodiments, the thickness coupling coefficient $k_t$ is 0.4 or greater. In an even more preferred embodiment, the thickness coupling coefficient $k_t$ is 0.43 or greater In some embodiments, the effective lateral coupling coefficient $k_{31,\mathit{eff}}$ is 0.18 or less and even more preferably 0.14 or less.

In other aspects of the present patent document, an acoustic transducer is provided. The acoustic transducer is made using one of the embodiments of the methods described herein and has the associated properties as a consequence of that manufacturing process.

As described more fully below, the apparatus and methods of the embodiments of an acoustic transducer eliminate or at least ameliorate some of the problems discussed above. Further aspects, objects, desirable features, and advantages of the apparatus and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

DETAILED DESCRIPTION OF THE EMBODIMENTS

Figure 1:
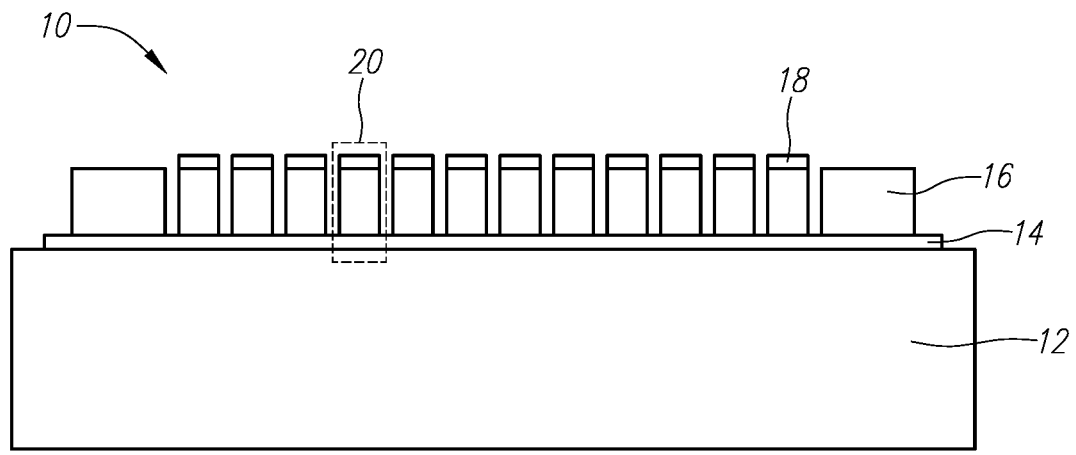
FIG. 1 illustrates a profile view of one embodiment of an integrated multi-element acoustic transducer.

Within the present patent document, ranges of values are used to help define different embodiments. When referring to any numerical range of values herein, such ranges are understood to include each and every number and/or fraction between the stated range minimum and maximum. For example, a range of about 0.05 to about 1.0, for example, would expressly include all intermediate values of about 0.05, 0.06, 0.07, all the way up to and including 0.98, 0.99 and 1.0. The same applies to all other elemental ranges set forth below, including those incorporated by reference below.

The present patent document relates to integrated multi-element acoustic transducers. In preferred embodiments, the transducers are configured to transmit/receive ultrasonic energy. Rather than try and manufacture such a transducer out of regular bulk piezoelectric material, the processes of the present patent document create an array of active elements by patterning electrodes above and/or below an active layer. In a preferred embodiment, the electrodes are patterned during electrode deposition. Either, or both, of the top and bottom electrodes may be patterned into individual elements. An element is an individual isolated circuit within the electrode. The overlapping area between a bottom and a top electrode element defines the active area. An active element consists of the volume of the bottom electrode, the active layer and the top electrode confined by the active area. In this way an active element can be individually excited/sensed. An array of active elements may be used for ultrasonic imaging since the deposited piezoelectric layer opens up for a wide range of frequencies that can be difficult to achieve with regular bulk piezoelectric materials.

Piezoelectric thick film may be used to fabricate ultrasound acoustic transducers with a frequency span typically from 5 MHz to 100 MHz. Ultrasonic transducers in this frequency range are suitable for transmitting/receiving ultrasonic energy for applications such as medical imaging, non-destructive testing and/or structural health monitoring.

The preferred embodiments disclosed herein use a piezoelectric thick film to construct a multi-element array. In a preferred embodiment, the methods disclosed herein use a backing layer, which serves also as the substrate for the deposition of the various other layers. Thus, the active layer may be fabricated directly on and in contact with the backing layer. Accordingly, the process sequence of conventional transducer manufacturing is reversed.

In preferred embodiments, the ultrasonic transducer structure has individual piezoelectric active elements defined by one or both of the electrode layers rather than physically separated. In traditional transducer manufacturing the individual active elements are created by dicing grooves or "kerfs" into one solid ceramic structure. Thus, the element shape is limited to straight lines and the minimum dimensions of the active elements are defined by the cutting resolution of the dicing process. Instead, in the present patent document, embodiments may be constructed where the size and distance between the active elements are only limited by the patterning techniques chosen. Thus, the active elements are not defined by traditional kerfs and can be termed kerfless. Accordingly, in the embodiments disclosed herein, the shape of the substrate may be varied more freely. Furthermore, embodiments according to the teachings herein may be constructed with top and bottom electrodes in any shape imaginable, opening up an endless variety of two dimensional arrays that could not be created using the previous manufacturing techniques.

A key element to creating an ultrasonic transducer from piezoelectric thick film by patterning electrodes to create the active elements instead of traditional dicing, is the creation of the active layer with the right properties. The thickness coupling coefficient of the active material (PZT thick film) $k_t$ should be higher than its effective lateral coupling coefficient $k_{31,eff}$. While the lateral coupling coefficient of the active layer is the property of the material itself, a piezoelectric film deposited on a substrate shows reduced lateral coupling due to the mechanical constraints caused by the clamping of the substrate. Consequently, it is necessary to introduce an effective lateral coupling coefficient $k_{31,eff}$ for this case. The effective lateral coupling coefficient $k_{31,eff}$ includes the effects of the mechanical constraint. In order to fabricate a kerfless ultrasonic array, the ratio of $k_t$ to $k_{31,eff}$ is crucial. To this end, preferred embodiments of an integral ultrasonic transducer as disclosed herein use an active material with $k_t$ greater than or equal to 0.32. In an even more preferred embodiment, the active material has $k_t$ value greater than or equal to 0.40, and even more preferably a $k_t$ value greater than or equal to 0.43.

Because the ratio of the $k_t$ value to the $k_{31,eff}$ value is so important, it is not just the $k_t$ value that is crucial but also the $k_{31,eff}$ value. In a preferred embodiment, the active material has an $k_{31,eff}$ value less than or equal to 0.24. In an even more preferred embodiment, the active material has an $k_{31,eff}$ value less than or equal to 0.20. In yet an even more preferred embodiment, the $k_{31,eff}$ value is less than or equal to 0.18 and even more preferably less than or equal to 0.14.

A preferable ratio between the $k_t$ and $k_{31,eff}$ ($k_t/k_{31,eff}$) values is 1.3 or greater. In an even more preferred embodiment, the ratio between $k_t$ and $k_{31,eff}$ is 2.2 or greater and even more preferably 3.0 or greater. To this end, other embodiments have a $k_t/k_{31,eff}$ ratio between 1.3 and 4.8. In a preferred embodiment, the $k_t/k_{31,eff}$ ratio is between 3.4 and 4.0. In an even more preferred embodiment, the $k_t/k_{31,eff}$ ratio is between 3.0 and 3.7.

In order to create a thick film with the correct thickness and effective lateral coupling coefficients, several process parameters have to be controlled including: the sintering temperature; the substrate that the active layer is deposited on and, the poling conditions.

To create the advantageous coupling ratios, the porosity of the active film is preferably between 10% and 60%, more preferably between 10% and 45%, even more preferably between 30% and 40%. The porosity of the active film is affected significantly by the sintering conditions of the film. To reach the given porosity values, the sintering conditions are very important. In a preferred embodiment, the sintering temperature should be between 600° C. and 1100° C., preferably 700° C. to 1000° C., even more preferably between 800° C. and 950° C. While the dwell time at the peak temperature should be between 5 minutes and 5 hours and more preferably between 0.5 hour and 2 hours. In another embodiment the active film may be sintered using infrared sintering in this case shorter dwell time may apply.

Coupling values may be significantly affected by the choice of the substrate. To begin with, the shrinkage of the film during sintering is affected by the presence of the substrate. The amount of shrinkage affects the porosity and thus, the coupling coefficients. Secondly, the residual stresses in the sintered film are determined by the degree of thermal mismatch between the film and the substrate. Accordingly, a substrate should be selected with a coefficient of thermal expansion that matches or is in correct proportion to the coefficient of thermal expansion of the film. To obtain a film with the advantageous properties mentioned above, the characteristics of the substrate are important and are discussed in further detail below.

In order to make the thick film piezoelectrically active, it is necessary to pole the material. The poling conditions also affect the properties of the film. The poling conditions have a particular influence on the $k_t$ value, which may be directly dependent on the poling conditions. In preferred embodiments, poling conditions that result in preferred values for $k_t$ are used. In a preferred embodiment, a poling temperature between room temperature and slightly above the Curie point is applied. In some embodiments, the poling temperature is between 20° C. and 350° C., more preferably between 50° C. and 200° C., and even more preferably between 100° C. and 170° C. The poling field should be chosen in accordance with the poling temperature. Preferably, the poling field is above 0.1 kV/mm and even more preferably the poling field is above 2 kV/mm. In a more preferred embodiment the poling field is between 2 and 12 kV/mm, and even more preferably between 3 and 10 kV/mm.

FIG. 1 illustrates a profile view of one embodiment of an integrated multi-element acoustic transducer 10. The transducer 10 includes a substrate 12, a bottom electrode 14 deposited on the substrate, an active layer 16 deposited on the bottom electrode 14 and configured to transmit/receive ultrasound energy, and a top electrode 18 deposited on the active layer 16. As may be seen in FIG. 1, the transducer 10 has a plurality of active elements 20 each formed by an instance of the patterned active layer 16, an instance of the patterned top layer 18 and the continuous bottom electrode 14.

As mentioned above, one step in the process of building an acoustic transducer is the selection of a substrate 12. In traditional transducers, both a backing layer and a substrate are needed. When an ultrasound wave is generated by an active element 20, the wave propagates both forward and backward. If the wave propagated backwards is reflected, it will interfere with the forward wave causing ringing and an extra echo in the signal. Thus, aiming for reducing ringing and echo issues, the backward wave should be suppressed. This absorption is typically the function of the backing layer but may be provided by the substrate 12 through careful material selection and manufacturing. One novel aspect of the embodiments disclosed herein is the selection of a substrate material that allows the substrate 12 to also be the backing layer.

In the embodiments disclosed herein, the substrate 12 may provide an integrated backing layer and mechanical support for the transducer 10. The substrate 12 is preferably selected such that the substrate 12 absorbs the acoustic energy radiated by the active layer 16 towards the substrate 12 direction. Having a substrate 12 that also serves the function of a backing layer has the advantage of integrating the acoustic absorption function into the substrate, thus improving the performance of the transducer 10.

In order to make a transducer with an integrated backing material, the properties of the substrate 12 are crucial. A substrate that provides a backing layer has the advantage of integrating the acoustic absorption function thus improving the performance of the transducer. Furthermore, it is advantageous to have acoustic properties of the backing material close to the acoustic properties of the piezoelectric layer. For the best results, the substrate material is carefully optimized with respect to the acoustic properties such as acoustic impedance and attenuation coefficient. The porosity of the substrate material is important for the attenuation coefficient and acoustic impedance. The attenuation coefficient increases with increasing porosity and the acoustic impedance decreases with increasing porosity. Values of the acoustic impedance could be below 50 MRayl, preferably 5-40 MRayl, more preferably 10-25 MRayl, even more preferably 10-20 MRayl (1 MRayl=$10^6$ kg/(m$^2$·s)). The attenuation coefficient generally increases with frequency so it is common to quote it with the unit dB/(mm·MHz). Preferably values for the attenuation coefficient could be higher than 0.07 dB/(mm·MHz), preferably higher than 0.26 dB/(mm·MHz), more preferably higher than 0.30 dB/(mm·MHz). The porosity could vary between 3.5% and 50%, preferably 10%-40%, even more preferably 15%-35%.

In a preferred embodiment, in addition to having absorbing properties, the substrate 12 may be chosen to have acoustic properties similar to that of the active layer 16.

The substrate 12 is preferably made from a ceramic material. In other embodiments, alternative materials such as, but not limited to, alumina, silicon and stainless steel may be used for the substrate 12.

There are several advantages of an integrated multi-element acoustic transducer. The integration of the backing layer as a substrate 12 provides excellent contact between the backing layer and the transducer. The integration also allows for various shapes of the substrate layer 12 with an appropriate backing. Moreover, integration saves a process step as the subsequent layers are fabricated directly on and in contact with the substrate 12, which serves as the backing layer.

Figure 2:
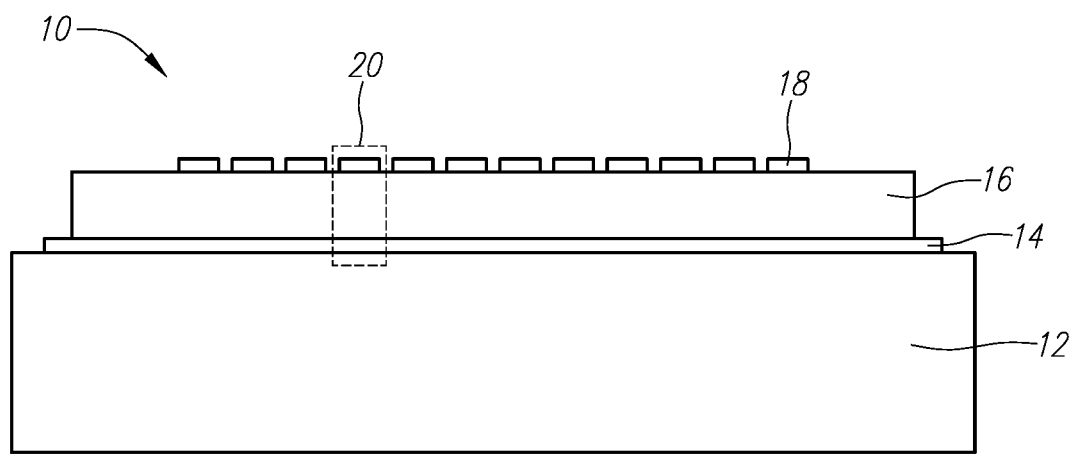
FIG. 2 illustrates a profile view of another embodiment of an integrated multi-element acoustic transducer.

FIG. 2 illustrates a profile view of one embodiment of an integrated multi-element acoustic transducer 10. The transducer 10 includes a substrate 12, a bottom electrode 14 deposited on the substrate, an active layer 16 deposited on the bottom electrode 14 and configured to transmit/receive ultrasound energy, and a top electrode 18 deposited on the active layer 16. As may be seen in FIG. 2, because the bottom electrode 14 is continuous, the active elements of transducer 10 are defined by the patterned top electrode. In the embodiment shown in FIG. 2, each element of the top electrode 18 defines an active element 20.

Although in a preferred embodiment, the bottom electrode layer 14 is deposited directly onto the substrate 12, in some embodiments, an inactive interface layer 22 may be deposited on the substrate 12 to prepare the surface of the substrate 12 for the bottom electrode deposition. The inactive interface layer 22 is also sometimes referred to as a "smoothing layer".

Figure 3:
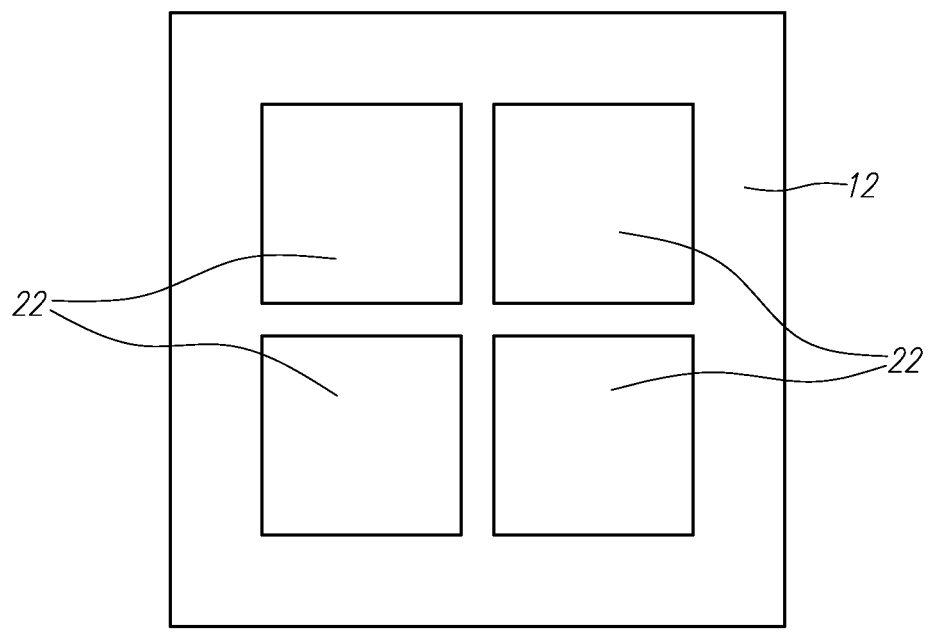
FIG. 3 illustrates one embodiment of a substrate with an inactive interface layer.

FIG. 3 illustrates one embodiment of a substrate 12 with an inactive interface layer 22. The inactive interface layer 22 is applied in a plurality of main areas, four in the case of this embodiment. For purposes of reference only, each of the four main inactive interface layers 22 is approximately 11 mm square. Each of the four inactive interface layers 22 will support the fabrication of a separate transducer array. Using the methods described herein, it is possible to fabricate multiple transducer arrays on a single substrate 12 and separate them in the end of the process as shown in FIG. 3.

Figure 4:
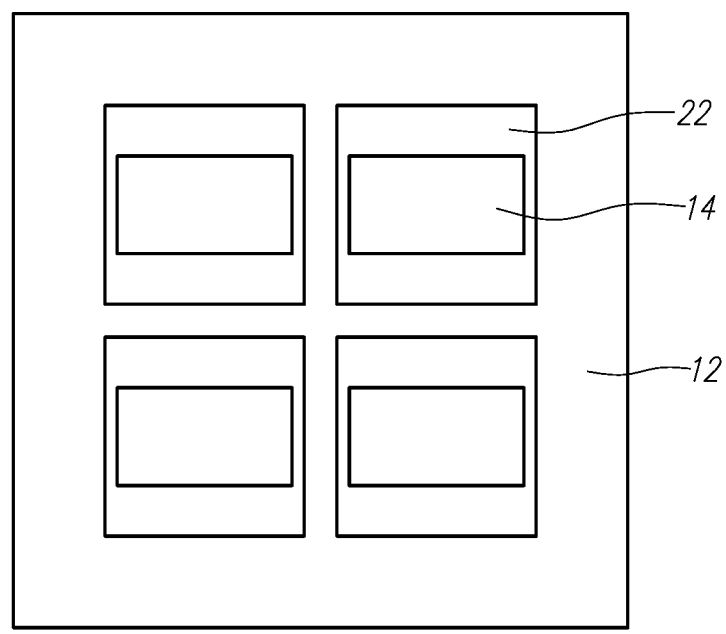
FIG. 4 illustrates the assembly of FIG. 3 with the addition of a bottom electrode layer deposited on the inactive interface layer.

FIG. 4 illustrates the assembly of FIG. 3 with the addition of a bottom electrode layer 14 deposited on the inactive interface layer 22. In one or more preferred embodiments, the bottom electrode 14 is deposited on the substrate 12 or inactive interface layer 22 by means of a screen-printing technique. In other embodiments, the bottom electrode 14 may be deposited by means of other thick-film or thin-film techniques such as pad printing, stencil printing, dip coating, CVD or PVD including sputtering and e-beam evaporation.

In preferred embodiments, the bottom electrode 14 is made of a metal such as, but not limited to, silver, gold, aluminum, platinum, nickel or any metal alloy.

As may be seen in FIG. 4, a plurality of bottom electrodes may be placed on a single substrate 12. In addition to placing multiple bottom electrodes 14 on a single substrate 12, in some preferred embodiments, the bottom electrode 14 is patterned in order to realize an array of elements whose shape, number and dimension are suitable for the application. In one or more embodiments, the patterning may be done together with the deposition process, as with screen-printing, pad printing, PVD including sputtering and e-beam evaporation, CVD techniques, or after the deposition process, by means of photolithography, micro-machining, chemical etching or laser scribing. However in other embodiments, the bottom electrode 14 may be a single continuous layer and not patterned. FIG. 4 illustrates four continuous bottom electrodes 14 placed on a single substrate 12.

In preferred embodiments, the bottom electrode 14 is thin enough to appear acoustically "invisible". If the bottom electrode 14 is too thick, or does not appear acoustically invisible for some other reason, the ringing in the transducer 10 will increase. To this end, the preferable thickness of the bottom electrode 14 is below 8 µm and preferably below 4 µm and even more preferably below 3 µm. In addition to appearing acoustically invisible, in most embodiments, the bottom electrode 14 has to survive 2 sintering rounds at temperatures above 700° C. and the material for the bottom electrode 14 must be selected accordingly.

Figure 5:
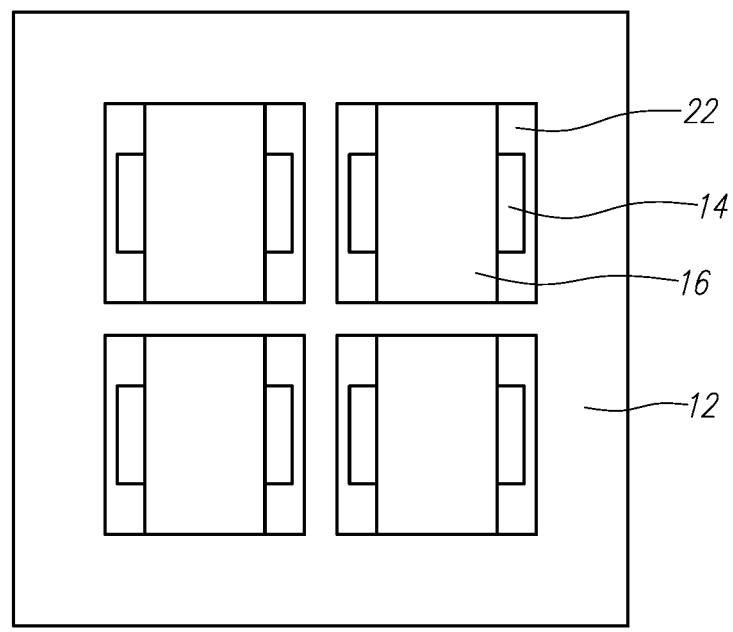
FIG. 5 illustrates the assembly of FIG. 4 with the addition of an active layer deposited on the bottom electrode.

FIG. 5 illustrates the assembly of FIG. 4 with the addition of an active layer 16 deposited on the bottom electrode 14. In a preferred embodiment, the active layer 16 is made from a piezoelectric material. Preferably, the piezoelectric thick film has a high thickness coupling factor. The purpose of the active layer 16 is to transmit/receive ultrasound energy and accordingly, the active layer 16 should be configured to do so.

In one or more embodiments, the active layer is made from doped lead zirconate titanate (PZT), which is a good choice with respect to the properties of the material and is also relatively low cost. In other embodiments, alternative piezoelectric materials such as, but not limited to, lead magnesium niobate-lead titanate (PMN/PT) or doped potassium sodium niobate (KNN), may be used for the active layer.

In one or more embodiments, the active layer is preferably deposited by means of screen-printing technique, employing a material such as thick-film TF2100. Examples of other techniques that may be used to deposit the active layer include pad printing, stencil printing and dip coating, to name a few.

In one or more embodiments, the active layer may be continuous. In other embodiments, the active layer 16 may be deposited in a pattern. In embodiments where the active layer is patterned, each instance of the pattern may be one of a plurality of active elements 20. In other embodiments the active layer 16 may be patterned after the deposition of the material by means of micro-machining, chemical etching or laser scribing.

Preferable thickness values of the active layer 16 in sintered conditions may be above 5 µm, more preferably the thickness values may vary in the range from 10 to 200 µm, even more preferably they may vary between 20-110 µm. The thickness of the active PZT layer determines the center frequency of the working range of the transducer. Consequently the frequencies may be below 200 MHz. A preferred frequency range is 5 to 100 MHz, more preferably 8-40 MHz. An even more preferred range is 12-30 MHz. In another embodiment the acoustic impedance of the active film is below 40 MRayl, more preferably between 10 MRayl and 22 MRayl, even more preferably between 13 MRayl and 18 MRayl.

As described above, an inactive interface layer 22 is placed on the substrate 12 prior to adding the bottom electrode 14. While adding an inactive interface layer 22 is preferable, it is not required. The inactive interface layer 22 may also be referred to as a smoothing layer 22. The smoothing layer 22 is important to create a good interface between the substrate 12, and the bottom electrode 14, which ensures a good acoustic coupling between the substrate and the active layer. Preferably the inactive interface layer is PZT thick film (TF2100).

When a good interface between the substrate 12 and active layer 16 is created, the acoustic ringing in the active layer is reduced. Low ringing is a crucial parameter for transducer performance.

For the smoothing layer to act as a good interface, the material has to be chemically and mechanically compatible with the active layer 16 and the substrate 12. Accordingly, in a preferred embodiment, the same material may be used for the smoothing layer 22 and the active layer 16. In a preferred embodiment, TF2100 is used for both the interface layer 22 and the active layer 16.

The deposition method and thickness of the inactive interface layer 22 also influence its performance. Preferable thicknesses for the inactive interface layer 22 are 1 to 50 μm in sintered conditions, and more preferably 10-30 μm, and even more preferably 10-20 μm. In a preferred embodiment, the deposition method is by printing the inactive interface layer.

Figure 6:
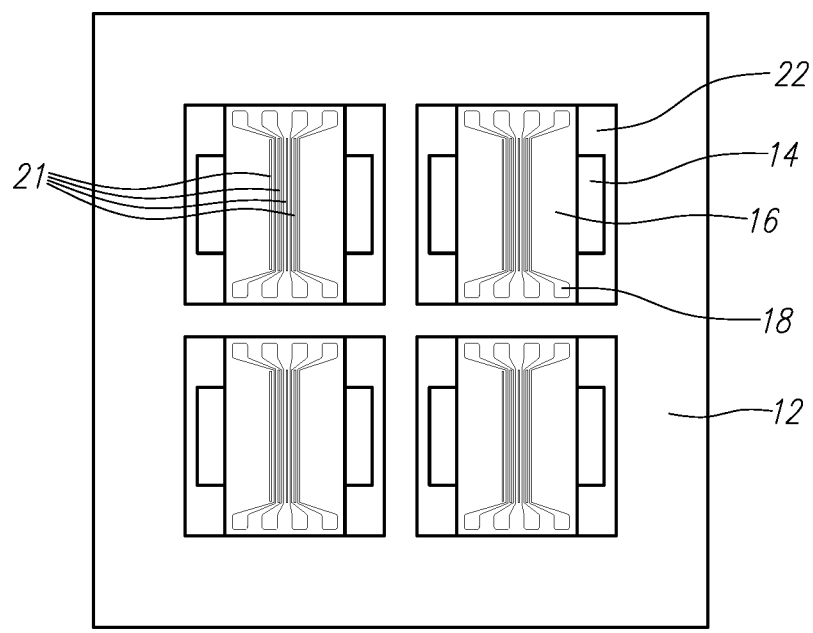
FIG. 6 illustrates the assembly of FIG. 5 with the addition of a top electrode layer deposited on the active layer.

FIG. 6 illustrates the assembly of FIG. 5 with the addition of a top electrode layer 18 deposited on the active layer 16. In one or more embodiments, the top electrode 18 is deposited on the active layer 16 by means of a screen-printing technique. In other embodiments, other methods of depositing the top electrode 18 on the active layer 16 may be used. In preferred embodiments, the top electrode 18 is made of a metal such as, but not limited to, silver, gold, aluminum, platinum, nickel or any other metal alloy.

The top electrode 18 may be continuous or patterned. As may be seen in FIG. 6, the top electrode 18 may include a plurality of elements 21 that are patterned onto the active layer 16. The top electrode 16 may be patterned in order to realize an array of active elements, whose shape, number and dimensions are suitable for the application. The patterning may be done together with the deposition process, as with screen printing, pad printing, PVD including sputtering and e-beam evaporation, CVD techniques, or after the deposition process, by means of photolithography, micromachining, chemical etching or laser scribing.

In a preferred embodiment, the top electrode 18 is patterned to form a plurality of elements 21, which in turn, provide a plurality of active elements, which can be individually excited/sensed. In preferred embodiments of the acoustic transducer, at least two active elements are created.

During manufacture, the active elements of the transducer 10, which are comprised by the bottom electrode 14, the active layer 16 and the top electrode 18, are poled to enable piezoelectric characteristics. Poling means that an electric field sufficiently high for aligning the ferroelectric domains is applied between the bottom electrodes 14 and top electrodes 18. The bottom electrodes 14 and top electrodes 18 provide a suitable electric connection to excite/sense from the active layer 16, thus transmitting/receiving an ultrasound acoustic signal.

When using the ultrasound transducer in its final application, an excitation signal is applied over the active elements. In one or more embodiments, the top electrode 18 is preferably connected to ground, while the excitation signal is applied to the bottom electrode 14, preventing external objects or human beings from getting in contact with the excitation signal. This configuration improves the safety in medical applications, and provides a shielded transducer, thereby increasing the Signal to Noise Ratio (SNR).

In some embodiments, the bottom electrode 14 may be continuous while the top electrode 18 is patterned providing an array of at least two active elements. FIGS. 4-6 demonstrate such an embodiment. As may be seen in FIG. 4, the bottom electrode 14 is a continuous rectangle while the top electrode 18 is a pattern of parallel straight lines running across the rectangle. When power is applied, such a configuration provides an array of active elements that can be individually used as transmitting/receiving elements, where the elements are integrated in one single device, avoiding individual machining and gluing of the active elements.

Moreover, each array of active elements may be patterned on the same substrate 12. FIGS. 4-6 show four groups of active elements each positioned on a corner of the substrate 12. In the embodiment in FIGS. 4-6, the bottom electrode is gold while the top electrode is silver.

In a preferred embodiment, the pattern of the electrodes may be optimized. There is an inverse linear relationship between the operating frequency of the transducer and the distance between the centers of two consecutive active elements, i.e. the pitch. Thus in general, a higher frequency will require a smaller pitch. One preferable configuration may be the so-called phased array where the pitch corresponds to half of the wavelength, or the so-called linear array where the pitch corresponds to the wavelength. Preferable values for the pitch are above 10 nm, more preferably above 1 μm, even more preferably above 30 μm. In another embodiment the preferred pitch is between 100 nm and 300 μm, more preferred the pitch is between 5 μm and 250 μm. For purposes of reference only, the array on the transducer in FIG. 6 is configured for a 200 μm pitch.

Figure 7A:
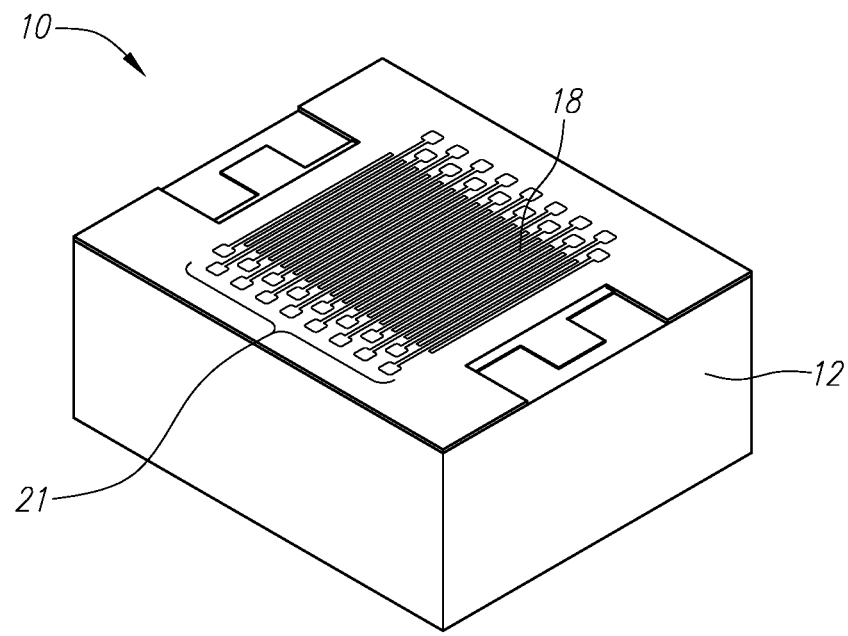
FIG. 7A illustrates an isometric view of a transducer with a top electrode that is comprised of a plurality of patterned lines.
Figure 7B:
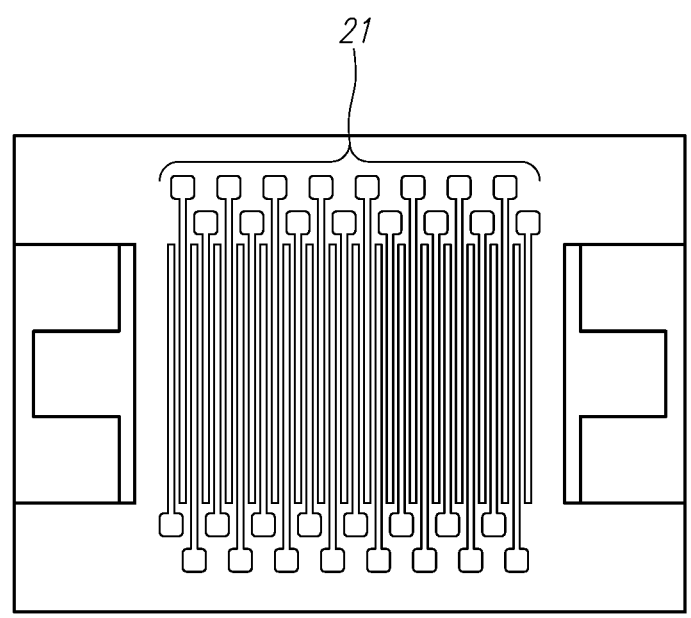
FIG. 7B illustrates a top down view of the transducer of FIG. 7A.
Figure 8:
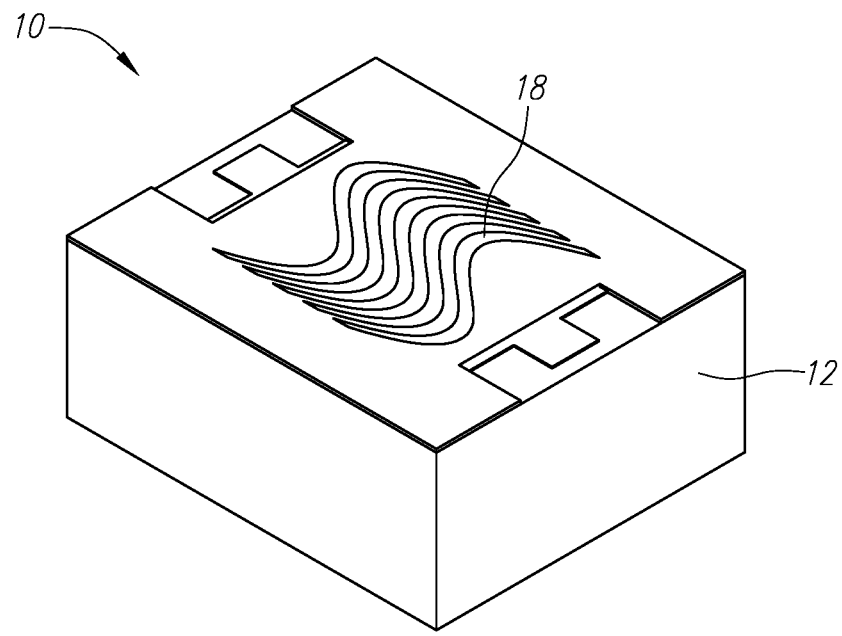
FIG. 8 illustrates an embodiment with a top electrode layer that has been patterned in a curved shape.

Electrode patterns may be formed in many different arrangements. In one or more embodiments, bottom and/or top electrodes have a pattern consisting of an array or a matrix of individual electrode elements. In preferred embodiments, bottom and/or top electrode elements have a line shape or other shapes such as, but not limited to, rectangles, squares, circles, concentric rings or spirals. FIG. 7A illustrates an isometric view of transducer 10 with a top electrode 18 that is comprised of a plurality of patterned lines. FIG. 7B illustrates a top down view of the transducer of FIG. 7A. FIG. 8 illustrates an embodiment with a top electrode layer that has been patterned in a curved shape. FIG. 8 also illustrates that the electrodes may be patterned into any shape.

Figure 9:
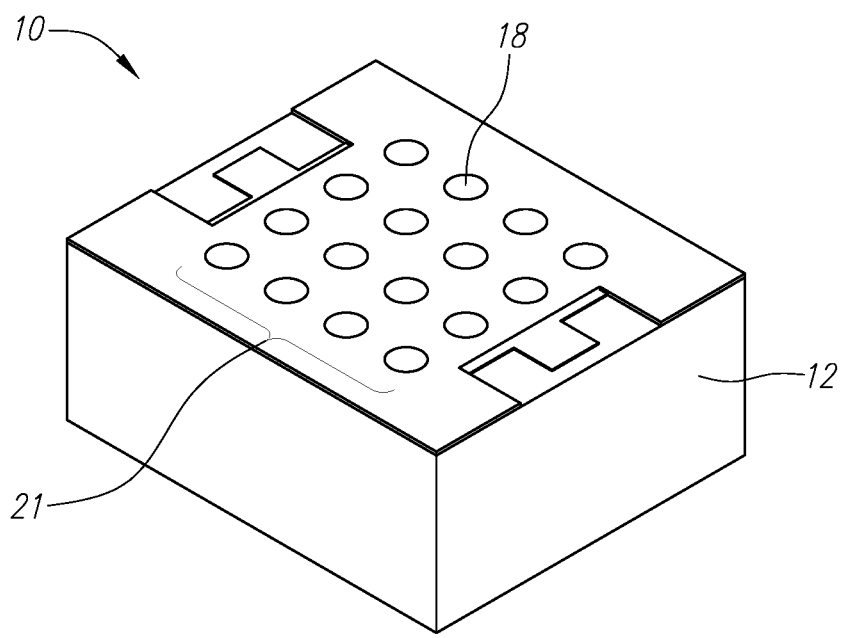
FIG. 9 illustrates a transducer with a 2D structure of active elements.

In other embodiments, both top and/or bottom electrodes can be patterned as a 2D structure of electrode elements. FIG. 9 illustrates a transducer 10 with a 2D structure of active elements formed in the top electrode. A transducer layout with a 2D element structure gives the possibility to construct 3D live images using an ultrasound scanner system.

Figure 10A:
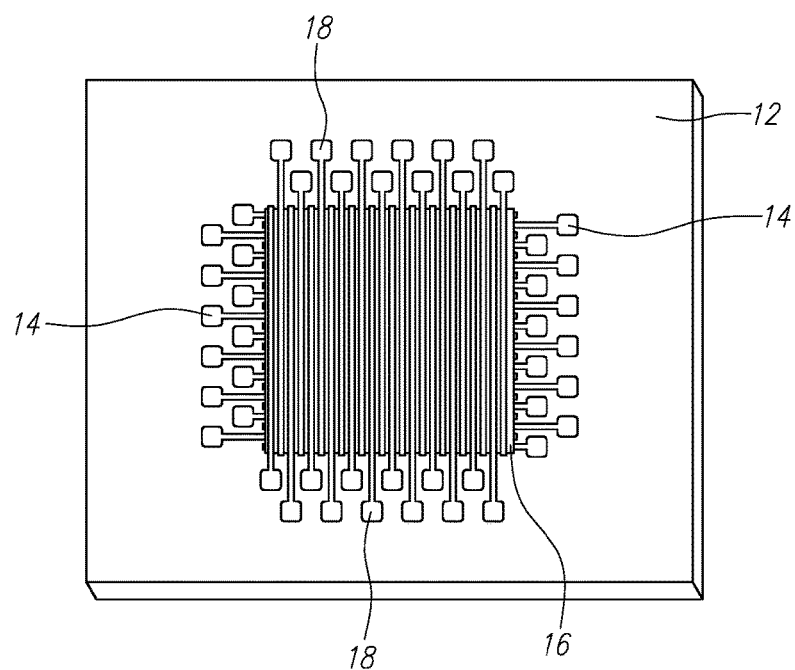
FIG. 10A illustrates an embodiment of a transducer with a row-column electrode configuration.
Figure 10B:
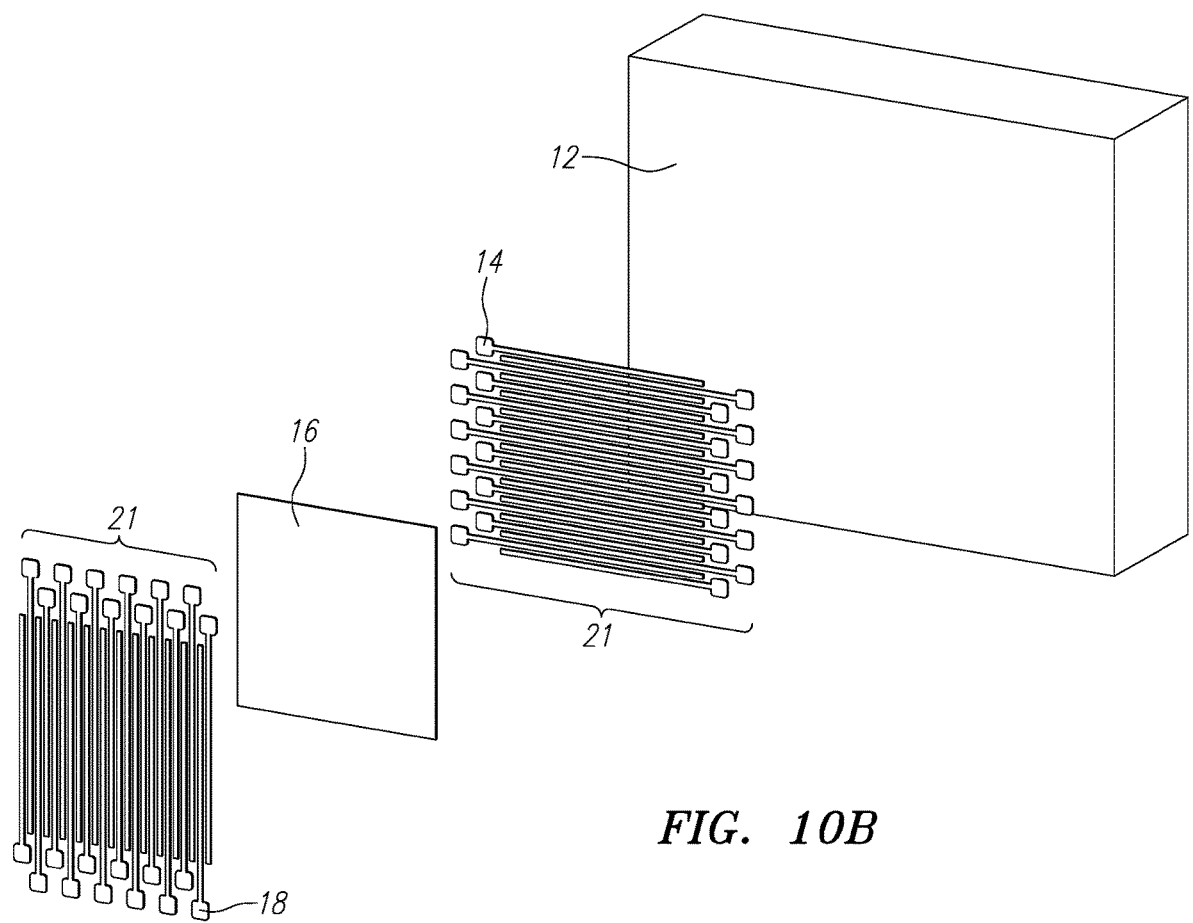
FIG. 10B illustrates an exploded view of the transducer of FIG. 10A.

In some embodiments with a 2D element structure, both top and bottom electrodes can be patterned as an array of electrode elements shaped as lines. This provides a special case of a 2D structure, hereafter referred to as the row-column configuration. By this naming convention it is understood that all rows belong to one electrode layer, e.g. the top electrode, and all the columns to the other electrode layer. FIG. 10A illustrates an embodiment of a transducer 10 with a row-column electrode configuration. FIG. 10B illustrates an exploded view of the transducer of FIG. 10A.

In the simplest case, the rows and columns are perpendicular, but in principle any angle between 0° and 180° is feasible. Designing a transducer 10 with a row-column configuration limits the amount of contacts to m+n compared to the regular 2D structure with m×n contacts, where m and n are the number of rows and columns, respectively. In a transducer with a row-column configuration, either an entire row or column is used to send/receive ultrasonic signals. For example, an ultrasonic signal may be sent from several rows and subsequently the echo may be received on several columns.

In order to improve the acoustic energy transfer and the performance of the transducer, some embodiments may have a matching layer deposited on the top electrode. The matching layer optimizes the acoustic coupling between the transducer and the medium. The matching layer may be made of a material such as, but not limited to, polymer, parylene, epoxy, silicone rubber or polydimethylsiloxane (PDMS). An adequate matching layer may be an important feature of a good functional ultrasonic transducer. In the case of a parylene coating, the signal may be increased over 40% and the signal to noise ratio may be increased over 50%.

Figure 11A:
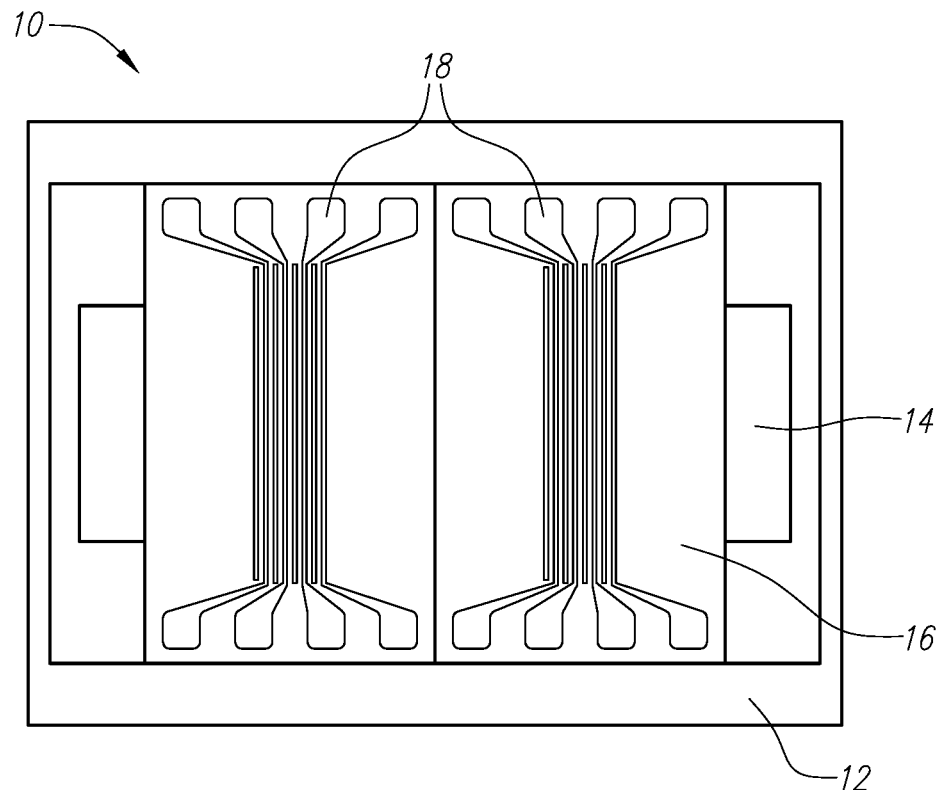
FIG. 11A illustrates one embodiment of an assembly with a plurality of integrated multi-element acoustic transducers on the same substrate.
Figure 11B:
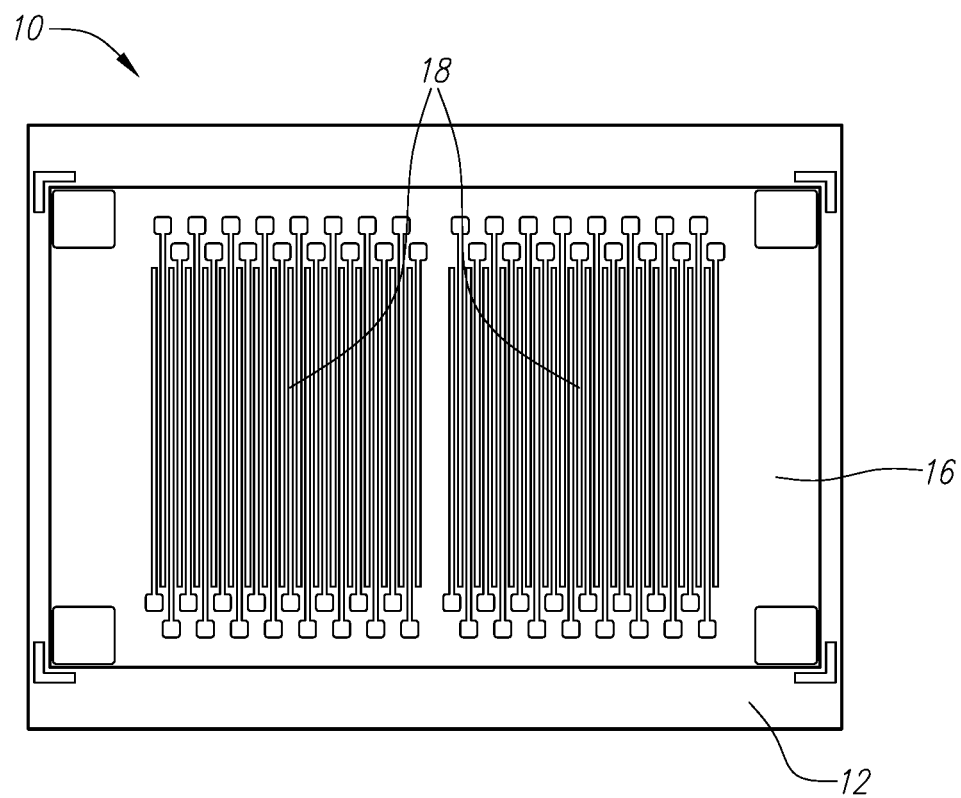
FIG. 11B illustrates another embodiment of an assembly with a plurality of integrated multi-element acoustic transducers on the same substrate.

In one or more embodiments, several integrated multi-element acoustic transducers may be embedded together, providing a more complex transducer having a higher number of active elements. FIGS. 11A and 11B both illustrate embodiments with a plurality of integrated multi-element acoustic transducers on the same substrate 12. As may be seen in FIG. 11A, two separate top electrodes 18 are created both sharing the same bottom electrode 14.

Figure 12A:
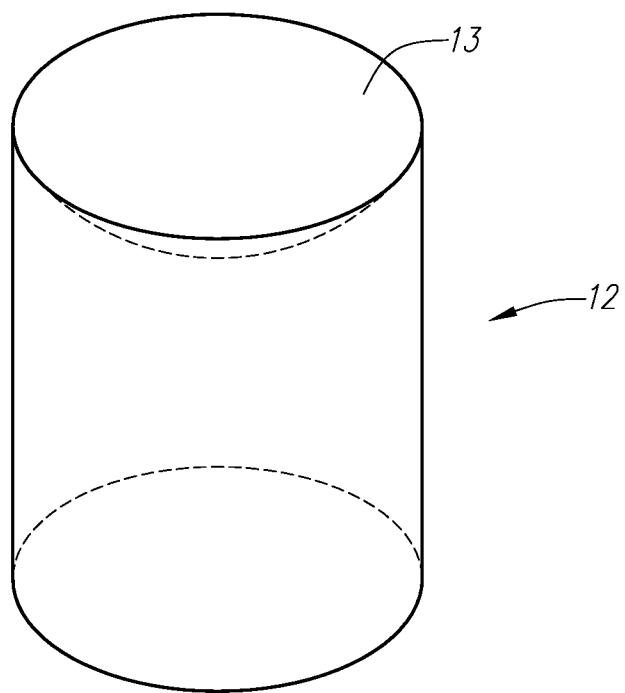
FIG. 12A illustrates an isometric view of one embodiment of a substrate that has a curved surface for deposition.
Figure 12B:
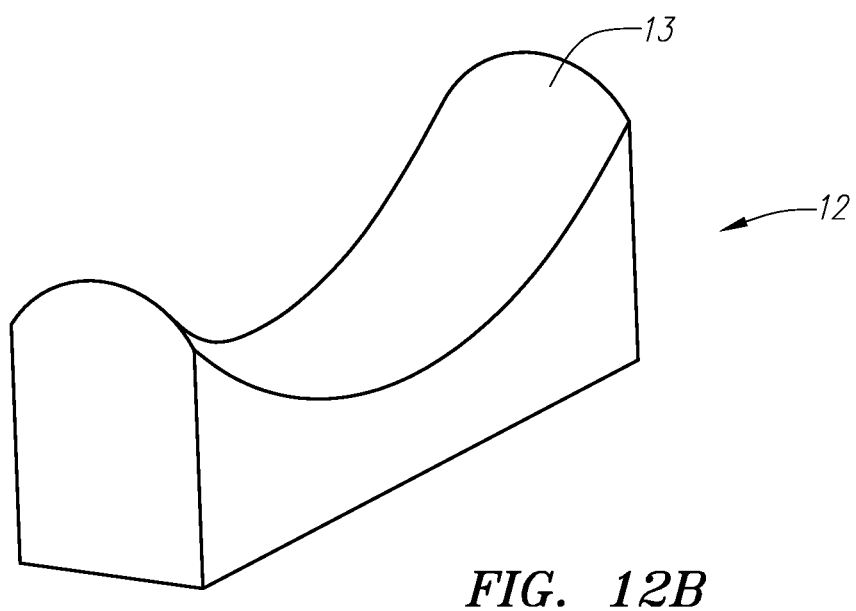
FIG. 12B illustrates an isometric view of another embodiment of a substrate that has a curved surface for deposition.

In some embodiments, the substrate may be machined before the bottom electrode deposition occurs. FIGS. 12A and 12B both illustrate a substrate 12 that has been machined to provide a curved surface 13 for deposition of the bottom electrode 14 (not shown). Providing a curved (either concave or convex) surface allows for the manufacture of focused array acoustic transducers, where the acoustic energy radiated by each active element is focused in one point. By machining the substrate, it is possible to make a focused array acoustic transducer without attaching a lens to the acoustic transducer. This is advantageous not only because it avoids an extra process step of attaching a lens to the acoustic transducer, but it also allows a lens-less transducer design. When a curved substrate is employed, screen printing and pad printing are the preferable techniques for bottom electrode 14, active layer 16 and top electrode 18 deposition and patterning. However, in other embodiments, other methods may be used.

Figure 13:
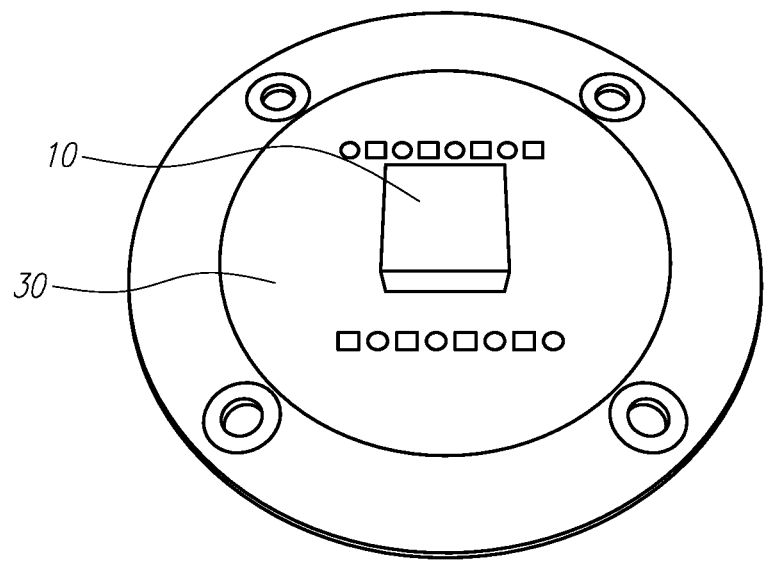
FIG. 13 illustrates one embodiment of an integrated multi-element acoustic transducer connected onto a Printed Circuit Board ("PCB").

As may be seen in FIG. 13, in some embodiments, the integrated multi-element acoustic transducer 10 may be packaged onto a Printed Circuit Board (PCB) 30. This will provide electrical connection and mechanical anchoring of the transducer 10, thus reducing the risk of damage and simplifying the handling and the electrical connection to the transmitting/receiving system. In other embodiments, flexible PCB, low-temperature co-fired ceramic (LTCC), high-temperature co-fired ceramic (HTCC), IC packaging or injection molding technologies may be used for the packaging of the transducer 10.

In some embodiments, the acoustic transducer 10 may be packaged using a flip-chip design. In such embodiments, the flip-chip soldering technique may be used, even if other techniques such as conductive gluing or wire bonding may be used for the packaging of the transducer 10. When the flip-chip technique is employed, a suitable aperture 32 in the packaging must be provided, allowing the radiated acoustic energy to propagate in the medium.

The performance of integrated multi-element acoustic transducers is mainly described by the operating center frequency, operating frequency bandwidth, insertion loss, and cross-talk between close active elements. Typical values for these parameters are: operating center frequency 8-50 MHz, operating frequency bandwidth (6 dB) 60%-200%, sensitivity above −70 dB, and crosstalk below −15 dB.

Figure 15:
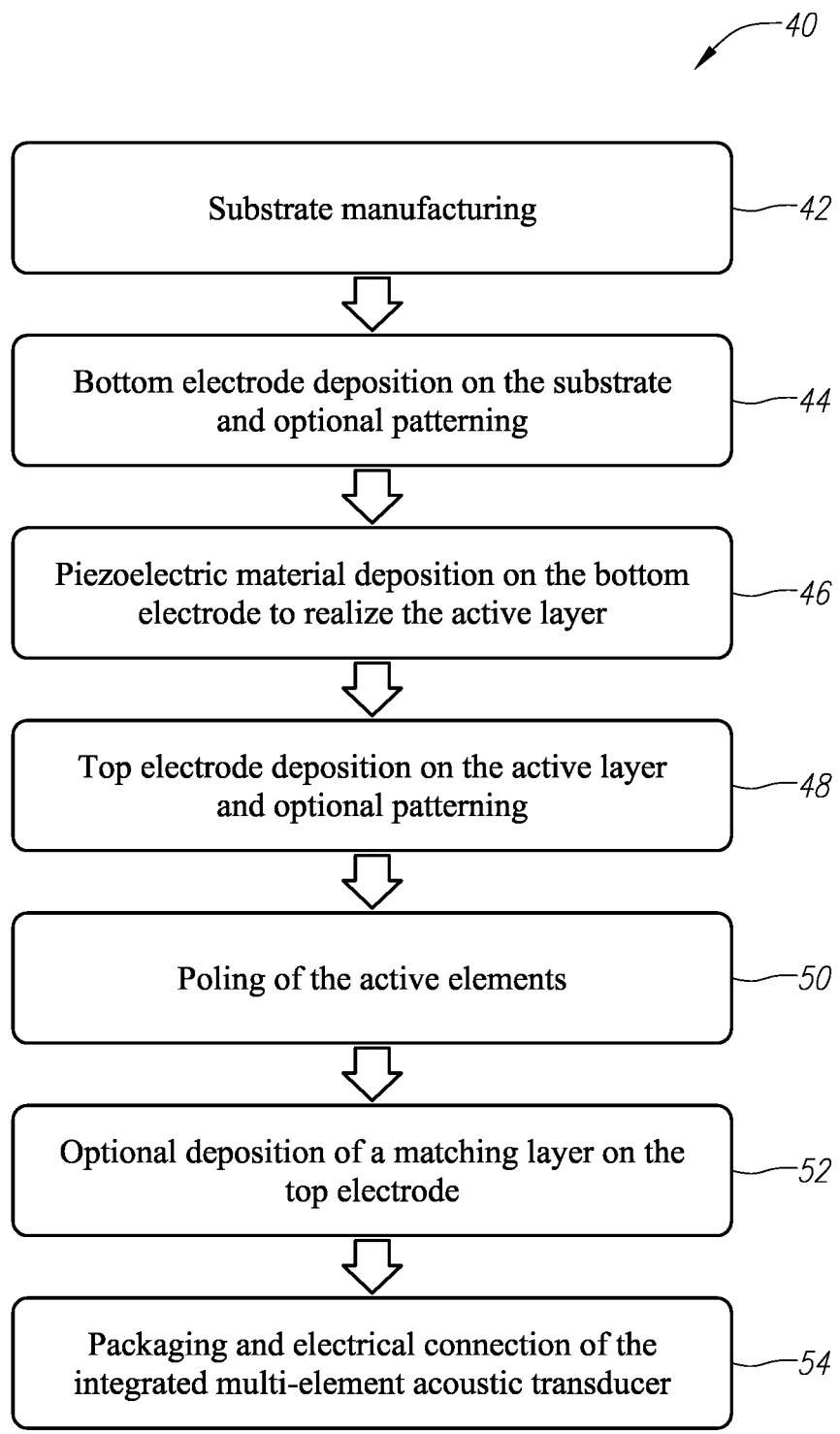
FIG. 15 illustrates one embodiment of a general overall process for forming an acoustic transducer.

FIG. 15 illustrates one embodiment of a general overall process for forming an acoustic transducer. As may be seen in FIG. 15, the first step is substrate material selection and manufacturing the substrate 42. Once the substrate is formed, the bottom electrode may be deposited on the substrate 44. In some embodiments, the bottom electrode 14 may be patterned. Once the bottom electrode is formed 44, a piezoelectric material is deposited on the bottom electrode to form the active layer 46. Next, the top electrode is deposited on the active layer. Similar to the bottom electrode, the top electrode may be optionally patterned. The main components of the transducer are now assembled and the active elements are poled to insure the piezoelectric qualities of the active layer in step 50. In some embodiments, an optional step 52 consisting of depositing a matching layer on top of the top electrode to enhance overall signal and signal to noise performance may be performed. Finally, in embodiments where the final product is formed into a component ready for integration, the acoustic transducer is packaged and electrically connected to its packaging 54.

Although one embodiment of a general overall process for manufacturing an acoustic transducer is given in FIG. 15, in order to add additional description, the particulars of a plurality of specific embodiments will now be described. These particulars are not meant as a limitation on the claims and should not be read into the claims unless specifically recited therein.

The first example embodiment is a 1D array. In order to manufacture the 1D array, a porous PZT substrate 12 with 20% porosity, a density of 6.5 g/cm$^3$ and acoustic impedance of 19 MRayl is fabricated with the dimensions 30 mm×30 mm×5 mm. This substrate may be seen in FIG. 3.

On the substrate an inactive interface layer 22 with the dimensions 11 mm×9 mm is screen printed with TF2100. The inactive interface layer 22 is designed to have a final thickness of about 20 µm using consecutive printing and drying cycles. At the final thickness, the PZT layer is sintered at elevated temperatures. As may be seen in FIG. 3, the inactive interface layer 22 is printed in a plurality of locations, each of which will have a separate acoustic transducer formed on it. The transducer may then be separated in the final step of the process.

The next step is to form the bottom electrode 14 as may be seen in FIG. 4. The embodiment shown in FIG. 4 has a bottom electrode 14 with dimensions of 10 mm×4.5 mm and is screen-printed on the inactive interface layer 22 using a commercial gold paste.

The next step is to deposit the active layer 16. In the embodiment shown in FIG. 5, the active layer 16 is a PZT material printed as a continuous layer with the dimensions 7 mm×9 mm. The active layer consists of TF2100 printed to a designed final thickness of 70 µm using consecutive printing and drying cycles. The final step is a sintering at elevated temperatures.

The array is now defined using the top electrode 18, which as shown in FIG. 6, consists of an 8-element line array with a pitch of 200 µm and an element width of 100 µm. In the embodiment shown in FIG. 6, the top electrode 18 is deposited using screen printing with a commercial silver paste.

Figure 14:
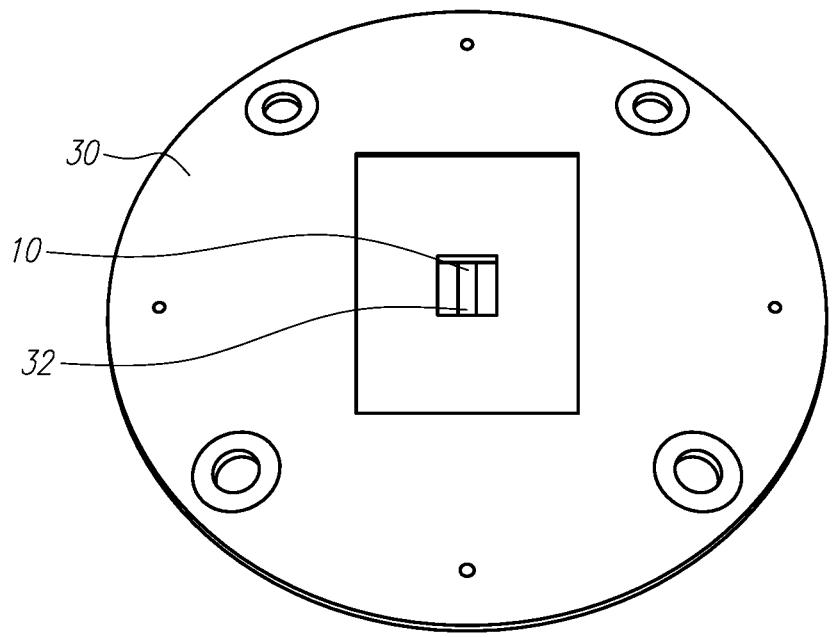
FIG. 14 illustrates one embodiment of a transducer soldered to a PCB with an opening in the PCB for the ultrasound transmission.

Next, the ultrasonic array is poled to be piezoelectrically active. As may be seen in FIG. 14, in some embodiments the transducer 10 may be soldered to a PCB with an opening for the ultrasound transmission. Then the PCB pads are masked and a 32 µm layer of parylene is deposited on the active elements by chemical vapor deposition ("CVD").

Figure 16:
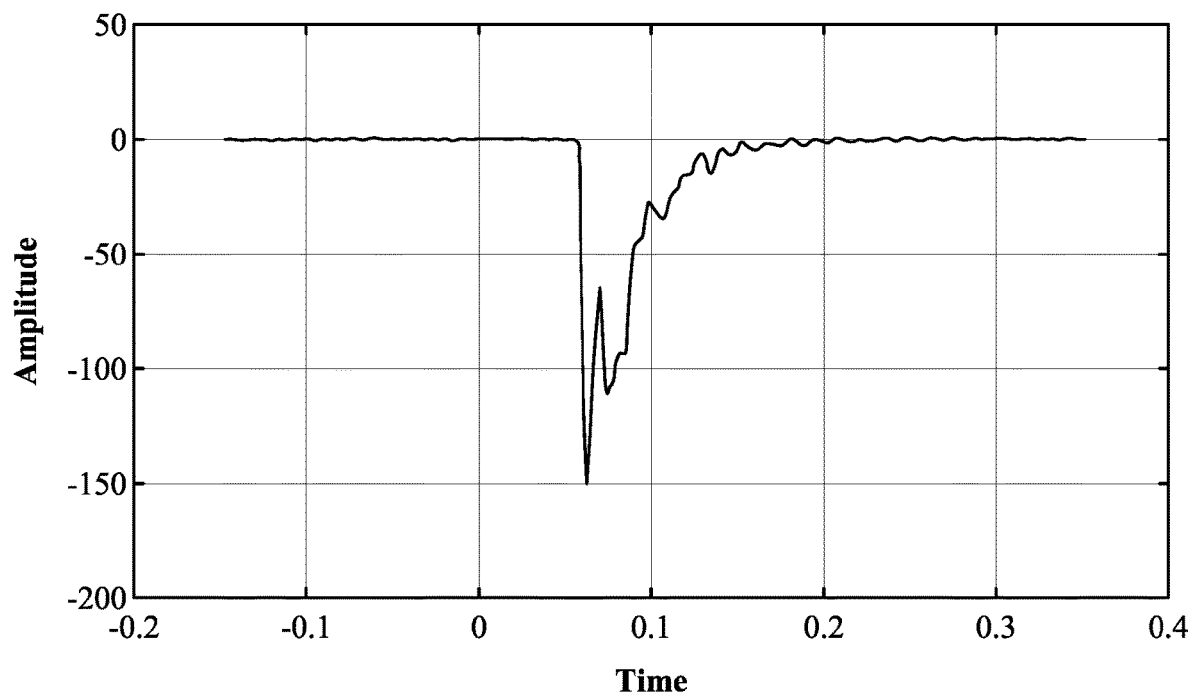
FIG. 16 is a plot of the amplitude versus time for an excitation profile of the acoustic transducer shown in FIG. 6.
Figure 17:
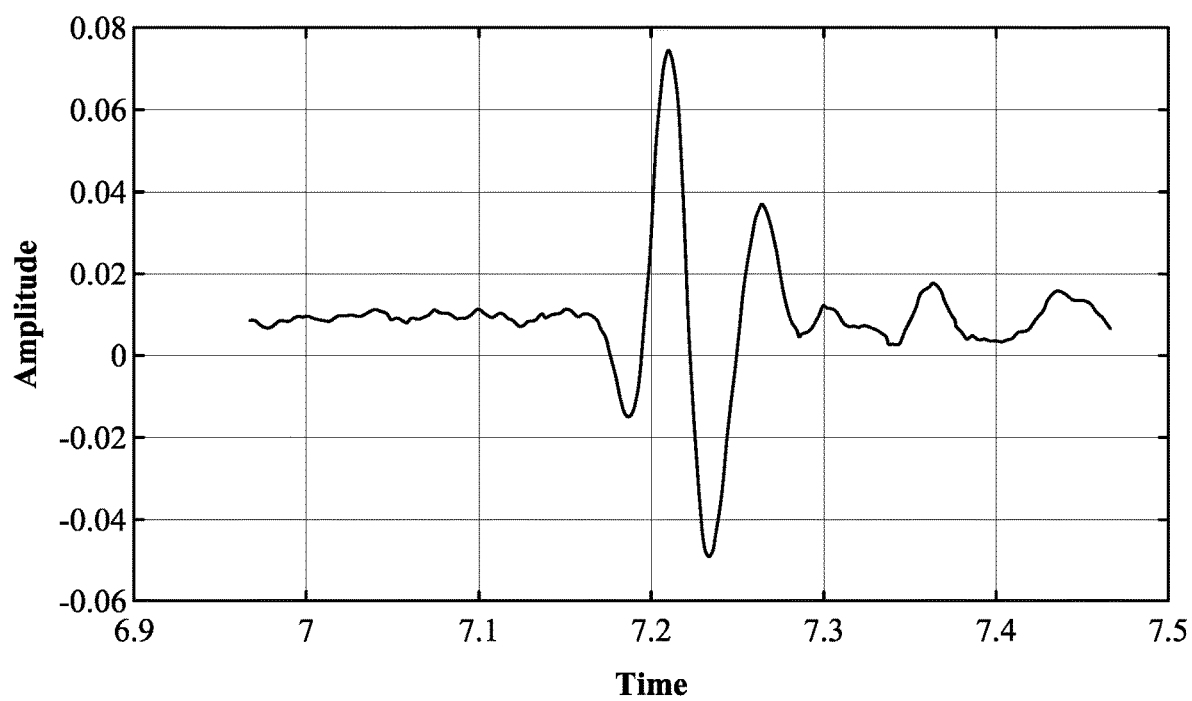
FIG. 17 is a plot of amplitude versus time of a response of the acoustic transducer shown in FIG. 6 corresponding to the excitation profile in FIG. 16.
Figure 18:
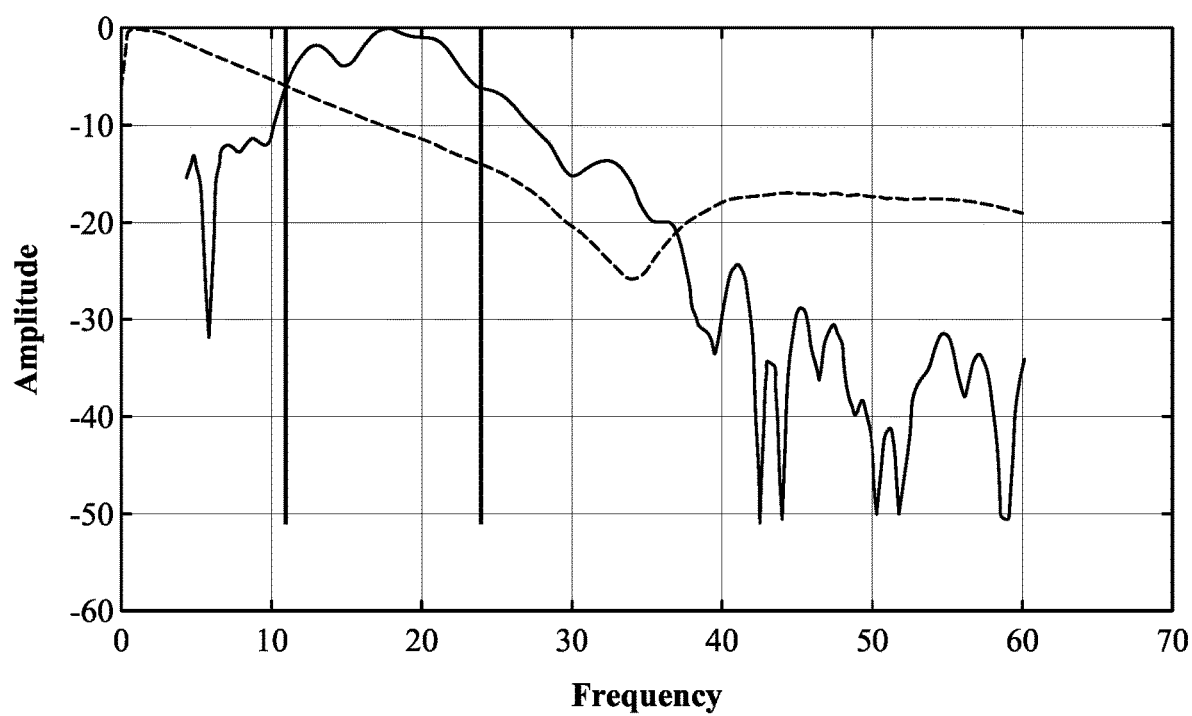
FIG. 18 is a plot of the Fourier transform of an excitation and response shown in FIGS. 16 and 17 of the acoustic transducer shown in FIG. 6.

FIGS. 16-18 illustrate the excitation and response of the transducers illustrated in FIG. 6. The embodiment illustrated in FIG. 6 is using a pulse-echo setup giving the pulse excitation shown in FIG. 16 and the pulse response shown in FIG. 17. FIG. 18 shows the Fourier transform of the pulse excitation and the pulse response with a marking for the 6 dB bandwidth. The center frequency is found as 17.4 MHz, a sensitivity of 60.8 dB, a bandwidth of 74.3% and a crosstalk of −31.2 dB.

In another embodiment, a 2D row-column transducer is manufactured. In such an embodiment, a porous PZT substrate with 30% porosity, a density of 5.5 g/cm$^3$, and an acoustic impedance of 12 MRayl is fabricated with an outer diameter of 10 mm and a thickness of 5 mm. Next, an inactive interface layer 22 of TF2100 is screen printed on the substrate. The layer is designed to have a final thickness of about 20 μm. Then, the PZT layer is sintered at elevated temperatures.

Once the inactive interface layer 22 is deposited, the bottom electrode 14 is added. In this embodiment, the bottom electrode 14 consists of an 8-element line array with a pitch of 200 μm and an element width of 150 μm. The bottom electrode 14 is screen printed using a commercial gold paste.

Once the bottom electrode 14 is deposited, the active layer 16 is printed as a continuous layer. In this embodiment, the active layer consists of TF2100, a PZT material, designed to have a final thickness of 85 μm after sintering at elevated temperatures.

Figure 19A:
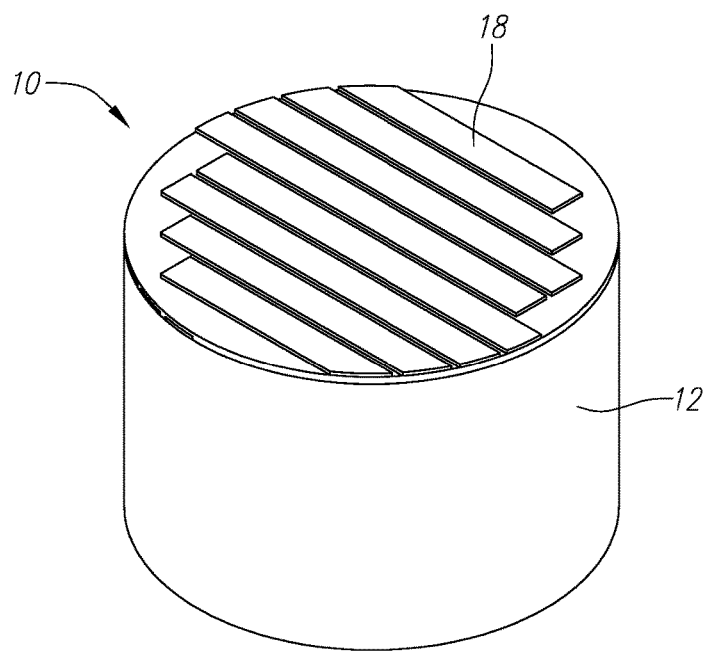
FIG. 19A illustrates an embodiment of a transducer with the top electrode element lines aligned perpendicular to the bottom electrode element lines.
Figure 19B:
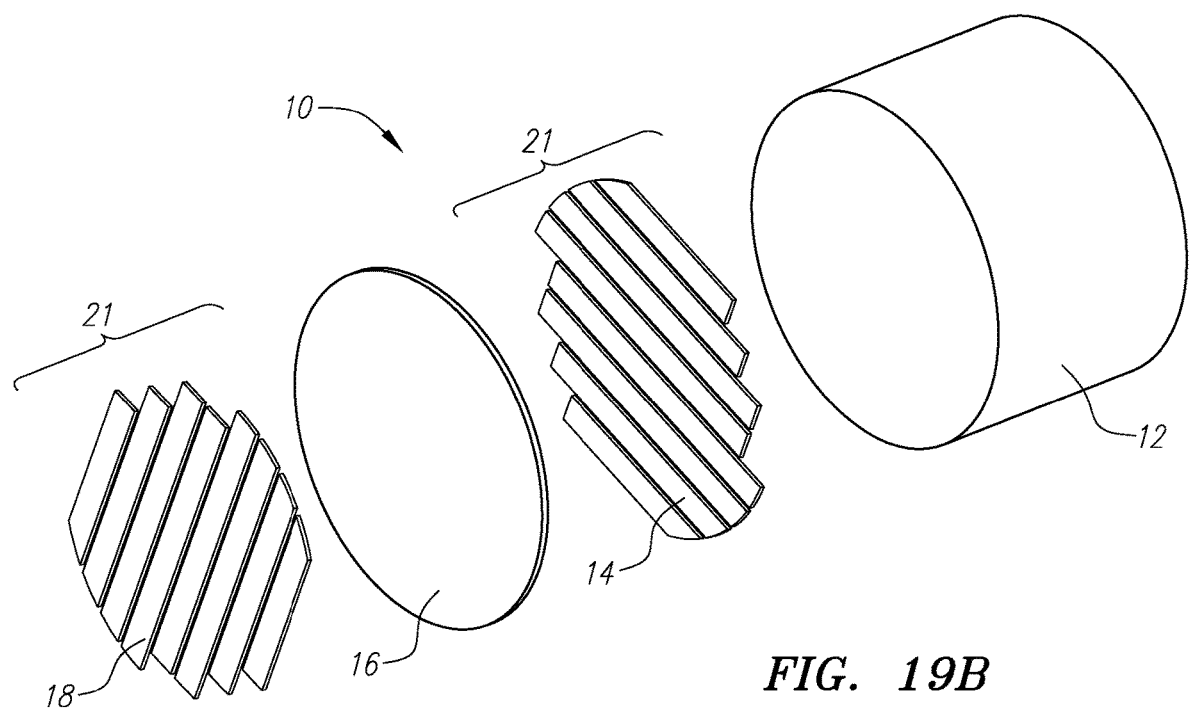
FIG. 19B illustrates an exploded view of the transducer of FIG. 19A.

In this embodiment, the top electrode 18 consists of an 8-element line array with a pitch of 200 μm and an element width of 150 μm. Like the bottom electrode 14 in this embodiment, the top electrode 18 is screen-printed. However, unlike the bottom electrode 14, which is made from commercial gold paste, the top electrode 18 is formed with a commercial silver paste. In this particular embodiment, the top electrode 18 element lines are aligned perpendicularly to the bottom electrode 14 element lines. FIGS. 19A and 19B illustrate one example of such an embodiment. The row-column principle shown in this embodiment is the same as FIGS. 10A and 10B but the substrate and the design of the array have been changed for ease of manufacturing. The ultrasonic array is poled to be piezoelectrically active. The transducer is soldered to a PCB with an opening for the ultrasound transmission.

Figure 20:
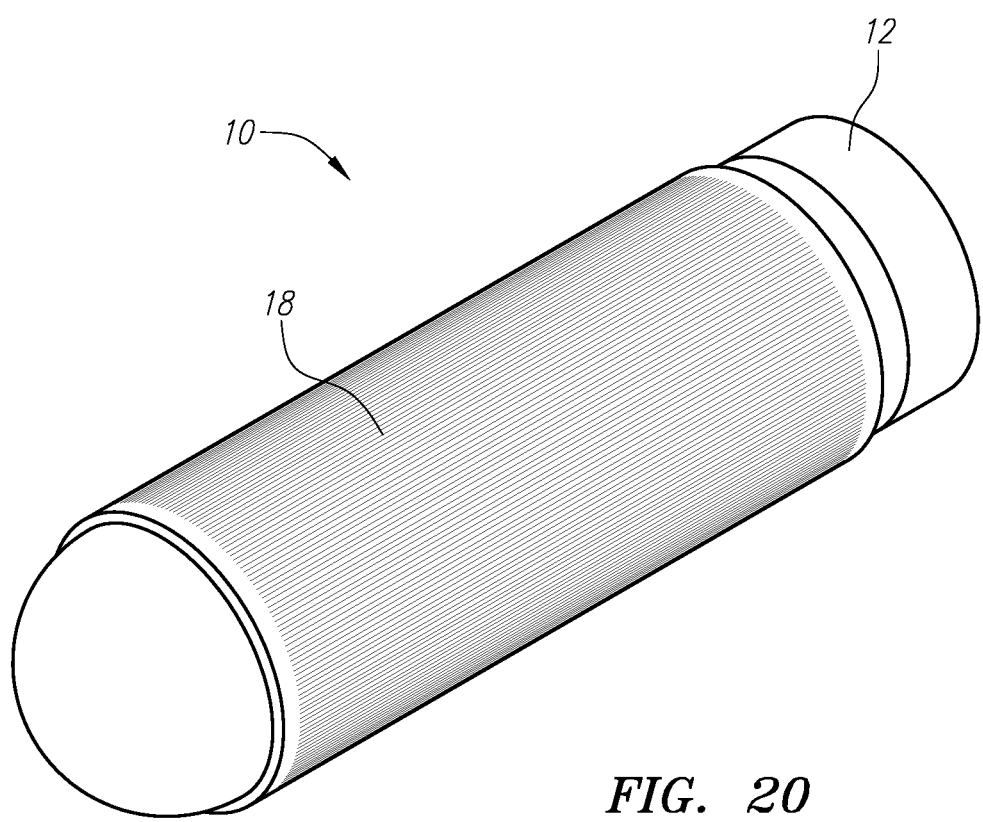
FIG. 20 illustrates an isometric view of an acoustic transducer with a 1D array on a curved substrate.

In yet another embodiment, an acoustic transducer is created with a 1D array on a curved substrate 12. In this particular embodiment, a porous substrate 12 with 30% porosity, a density of 5.5 g/cm$^3$, and an acoustic impedance of 12 MRayl serves as backing layer and as a mechanical substrate. In this embodiment, the substrate 12 is fabricated with a cylindrical shape, having an outer diameter of 30 mm, and a hole in the center with a diameter of 4 mm for handling. FIG. 20 illustrates the transducer 10 including such a substrate 12. The length of the cylinder in the embodiment of FIG. 20 is 8 mm.

Similar to other embodiments described herein, although not required, an inactive interface layer 22 is added to the substrate. The inactive interface layer 22 consists of TF2100 deposited on the curved surface either by dip coating or by pad printing. This provides a continuous layer. When using pad printing, a continuous layer may be manufactured by depositing contiguous patches of material, overlapped at the edges. In this embodiment, the final thickness of the inactive interface layer 22 after sintering is designed to be 20 μm.

Next, the bottom electrode 14 is added as a continuous covering over most of the substrate 12. The bottom electrode 14 consists of a commercial gold paste deposited either by dip coating or by pad printing. The active layer 16 is added over the bottom electrode 14. The active layer 16 is continuous and consists of TF2100 deposited either by dip coating or by pad printing. The final thickness after sintering is designed to be 90 μm. Finally, the top electrode 18 defines the ultrasonic array outlined as a 200 μm pitch line array with an element width of 100 μm. A commercial silver paste is used to screen-print a segment of 24 elements at a time, the substrate is then rotated by a suitable angle and the next 24 elements are printed. In this particular embodiment, the specification result in 456 active elements. The array is poled to be piezoelectrically active.

Although the embodiments have been described with reference to preferred configurations and specific examples, it will readily be appreciated by those skilled in the art that many modifications and adaptations of the acoustic transducer methods of making the same described herein are possible without departure from the spirit and scope of the embodiments as claimed hereinafter. Thus, it is to be clearly understood that this description is made only by way of example and not as a limitation on the scope of the embodiments as claimed below.

What is claimed is:

1. A method of fabricating an acoustic transducer comprising:
   fabricating a substrate;
   depositing a bottom electrode on the substrate;
   depositing a piezoelectrically active layer on the bottom electrode to form an active layer with an effective lateral coupling coefficient $k_{31,eff}$ of less than 0.24;
   depositing a top electrode on the active layer;
   wherein at least one electrode is patterned to form at least two active elements; and,
   wherein a ratio of a thickness coupling coefficient $k_t$ to an effective lateral coupling coefficient $k_{31,eff}$ of the active layer is 1.3 or greater.

2. The method of claim 1, wherein the ratio is 2.2 or greater.

3. The method of claim 1, wherein the ratio is 3.0 or greater.

4. The method of claim 1, further comprising:
   depositing an inactive interface layer on the substrate prior to depositing the bottom electrode.

5. The method of claim 1, wherein the substrate is designed to provide both an integrated backing layer and a mechanical support.

6. The method of claim 1, where the bottom electrode, the top electrode and the active layer are pad printed or screen printed.

7. The method of claim 1, wherein the active layer is deposited as a continuous thick film.

8. The method of claim 1, wherein the active layer is patterned into individual elements during the deposition step.

9. The method of claim 1, wherein the active layer is sintered between 800° C. and 950° C. for between 0.5 and 2 hours.

10. The method of claim 1, further comprising poling the active layer between 100° C. and 170° C. with an applied voltage in the range of 3 kV/mm to 10 kV/mm.

11. The method of claim 1, wherein the active layer is made from doped PZT or doped KNN.

12. The method of claim 1, wherein the active layer is made from TF2100.

13. The method of claim 1, wherein the substrate is machined into a curved surface prior to any of the depositing steps and the subsequent depositing steps are performed on the curved surface.

14. The method of claim 1, wherein elements are patterned during both the depositing a top electrode and depositing a bottom electrode steps.

15. A method of fabricating an acoustic transducer comprising:
   fabricating a substrate;
   depositing an inactive interface layer;
   depositing a bottom electrode on the substrate;
   depositing a piezoelectrically active layer on the bottom electrode to form an active layer with an effective lateral coupling coefficient $k_{31,eff}$ of less than 0.24;

depositing a top electrode on the active layer;
poling the piezoelectrically active layer;
wherein at least one electrode is patterned to form at least two active elements; and,
wherein a ratio of a thickness coupling coefficient kt to an effective lateral coupling coefficient $k_{31,\mathit{eff}}$ of the active layer is 1.3 or greater.

16. The method of claim 15, wherein the ratio is between 3.0 and 3.7.

17. The method of claim 15, wherein the ratio is between 3.4 and 4.0.

18. The method of claim 15, wherein the effective lateral coupling coefficient $k_{31,\mathit{eff}}$ is 0.18 or less.

19. The method of claim 15, wherein the effective lateral coupling coefficient $k_{31,\mathit{eff}}$ is 0.14 or less.

20. The method of claim 15, wherein the substrate is designed to provide both an integrated backing layer and a mechanical support.

21. The method of claim 15, wherein the substrate is designed to have a porosity between 15% and 35%.

22. The method of claim 15, where the bottom electrode, the top electrode and the active layer are pad printed or screen printed.

23. The method of claim 15, wherein the active layer is deposited as a continuous thick film.

24. The method of claim 15, wherein the active layer is patterned into individual elements during the depositing the active layer step.

25. The method of claim 15, wherein the active layer is sintered between 800° C. and 950° C. for between 0.5 and 2 hours.

26. The method of claim 15, further comprising poling the active layer between 100° C. and 170° C. with an applied voltage in the range of 3 kV/mm to 10 kV/mm.

27. The method of claim 15, wherein the active layer is made from TF2100.

\* \* \* \* \*